(12) United States Patent
Stoutenburg et al.

(10) Patent No.: US 12,085,616 B2
(45) Date of Patent: Sep. 10, 2024

(54) SYSTEM AND METHOD FOR MANAGING MONITORING EQUIPMENT OF A LARGE ELECTRIC MACHINE

(71) Applicant: VIBROSYSTM INC., Longueuil (CA)

(72) Inventors: Cody Stoutenburg, Longueuil (CA); Simon Ethier, Longueuil (CA); Vincent Lecomte, Longueuil (CA)

(73) Assignee: VIBROSYSTM INC., Longueuil (CA)

( * ) Notice: Subject to any disclaimer, the term of this patent is extended or adjusted under 35 U.S.C. 154(b) by 107 days.

(21) Appl. No.: 17/846,088

(22) Filed: Jun. 22, 2022

(65) Prior Publication Data

US 2023/0194610 A1 Jun. 22, 2023

Related U.S. Application Data

(60) Provisional application No. 63/290,360, filed on Dec. 16, 2021.

(51) Int. Cl.
*G01R 31/34* (2020.01)
*H02K 7/18* (2006.01)
*H04L 67/12* (2022.01)

(52) U.S. Cl.
CPC ............ *G01R 31/343* (2013.01); *H04L 67/12* (2013.01); *H02K 7/1823* (2013.01)

(58) Field of Classification Search
CPC ..... G01R 31/343; H04L 67/12; H02K 7/1823
See application file for complete search history.

(56) References Cited

U.S. PATENT DOCUMENTS

| | | | | |
|---|---|---|---|---|
| 6,714,977 B1* | 3/2004 | Fowler | ............... | H04L 12/2825 |
| | | | | 709/224 |
| 10,097,984 B2* | 10/2018 | Kim | .................... | H04L 43/0847 |
| 10,678,668 B1* | 6/2020 | Wolfe | ................. | G06F 11/3476 |
| 2012/0119628 A1 | 5/2012 | Schwery et al. | | |
| 2015/0142526 A1* | 5/2015 | Forbes, Jr. | ............. | G05D 17/00 |
| 2015/0234011 A1 | 8/2015 | Cloutier | | |
| 2019/0072460 A1* | 3/2019 | Aldridge | ................. | H04L 67/12 |

(Continued)

FOREIGN PATENT DOCUMENTS

CN 210670149 6/2020
WO WO2021003576 1/2021

*Primary Examiner* — Akm Zakaria
(74) *Attorney, Agent, or Firm* — Alexandre Daoust; Norton Rose Fulbright Canada LLP

(57) ABSTRACT

The method can include computing actions corresponding to the difference between a current local state of the managed devices and a target local state for the managed devices, said actions to be executed by the managed devices for bringing the current local state into compliance with the target local state; communicating the actions to the managed devices, via the local network, for execution; subsequently to said communicating instructions, monitoring current states of the managed devices, including detecting a change in the current states of the managed devices, the change reflecting the execution of at least one of the actions at the managed devices, and updating the current local state to reflect the change; computing updated actions corresponding to an updated difference between the current local state and the target local state, following said updating, said at least one executed action being absent from the updated actions; communicate the updated actions to the managed devices, via the local network.

19 Claims, 12 Drawing Sheets

(56) References Cited

U.S. PATENT DOCUMENTS

| | | | |
|---|---|---|---|
| 2019/0128966 A1* | 5/2019 | Vinson | G01R 19/2513 |
| 2020/0088202 A1* | 3/2020 | Sigmar | E21B 43/26 |
| 2022/0365137 A1* | 11/2022 | Manson | G01R 31/346 |
| 2022/0417119 A1* | 12/2022 | Sandridge | H04L 63/102 |

* cited by examiner

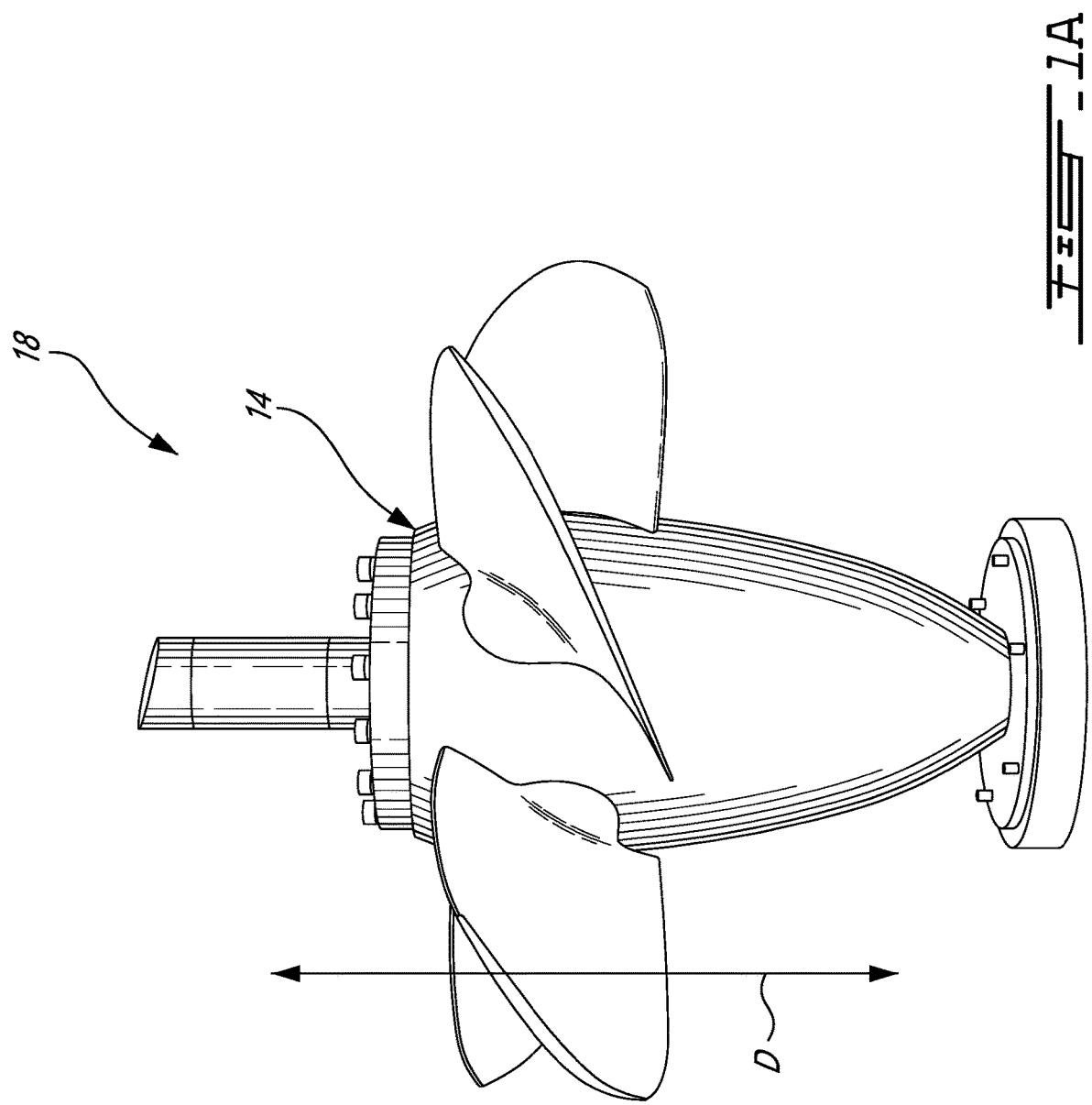

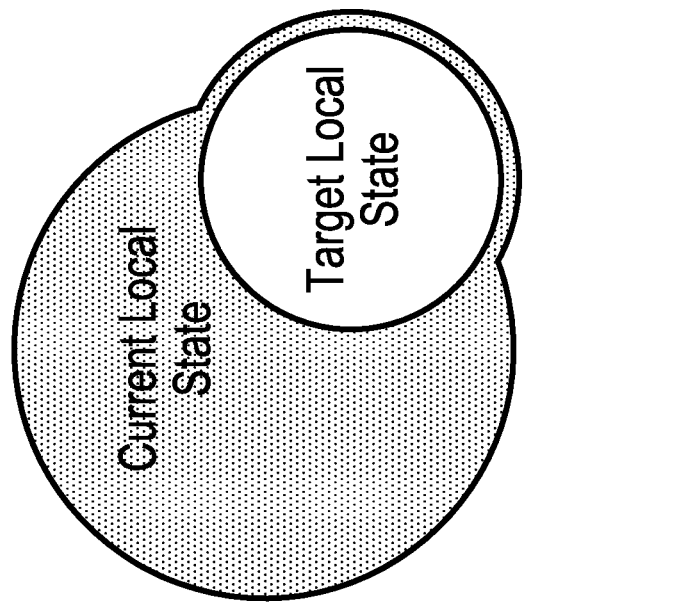
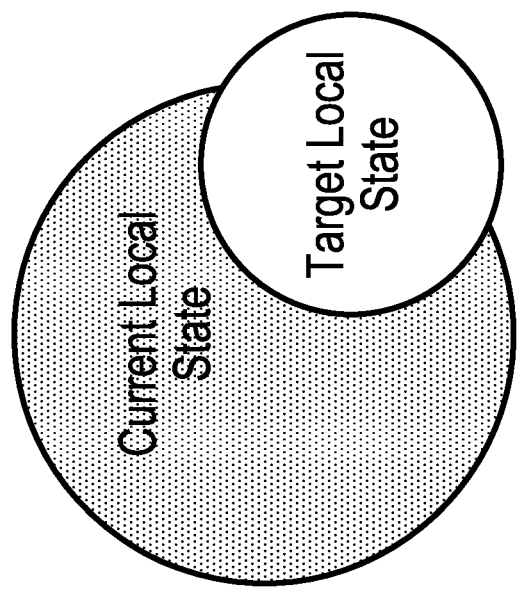
FIG. 6

SYSTEM AND METHOD FOR MANAGING MONITORING EQUIPMENT OF A LARGE ELECTRIC MACHINE

FIELD

Embodiments described herein relate computerized sensor networks associated to large, e.g. MW-range, electrical machines, and more particularly to an edge device therefore with cloud connectivity.

INTRODUCTION

Large rotary electrical machines such as MW range electrical hydro-generators or electrical mills in the mining industry for instance, can be considered "critical" in the sense that eventual downtime can be highly undesirable and associated to significant costs. There is thus typically much effort and investment which are made in terms of improving their efficiency and managing maintenance requirements. There can be a strong incentive to acquire early signs of an eventual need for maintenance so that maintenance can be planned and executed in an optimized manner. Such early signs may be acquirable by the use of sensors such as vibration sensors, air gap sensors, temperature sensors, etc. There can be an incentive to centralize the acquired data in a manner to have a fuller picture of the machine's health. For this reason, it is typical to equip such large electrical machines with a sensor network including various sensors, acquisition equipment, and higher functionality devices such as alarm engines and diagnostic applications (e.g. SCADA). Many of such equipment can require management in the form of monitoring, software updates and configuration updates to name a few potential examples. Although existing management techniques were satisfactory to a certain degree, there always remains room for improvement.

SUMMARY

It was found that managing sensor equipment via the cloud represented both a source of challenges and a source of opportunities. On the one hand, operating via the cloud theoretically offered a high degree of versatility and efficiency. On the other hand, sensor equipment on such infrastructure is often considered critical and rendering their continued operation dependent on cloud connectivity did not appear to be a suitable avenue, especially in situations where cloud connectivity at the infrastructure can be intermittent or otherwise not continuously reliable.

It was found that such challenges can be addressed, at least to a certain extent, via particular processes performed by an edge device.

The edge device can be computer hardware which can provide both a local entry point to the sensor network, and an external entry point to a telecommunications network. The edge device can be used to control data flow at the boundary (e.g., an edge) between the sensor network and a telecommunications network such as the internet. The edge device can translate data between protocols, formats, or languages into a suitable protocol, format, or language for cloud servers, networks and data storage. A cloud-managed edge devices may operate without cloud connectivity when autonomous (i.e. with proper local resources and computing capabilities), while still requiring connectivity at some point, even if the frequency or duration of connected time periods can be random and limited.

In accordance with another aspect, there is provided a local computer for managing managed devices, the managed devices and the local computer being local to a facility having at least one electric machine monitored by sensors, the electric machine having a peak power of at least 100 kW, the managed devices having at least one acquisition unit for the sensors, the managed devices configured to communicate over a local network, the local computer positioned at a boundary between the local network and a telecommunications network, the local computer configured to communicate i) with the managed devices via a local network and ii) with a remote computer via a telecommunications network, the local computer having: non-transitory memory storing executable instructions; a hardware processor that executes the instructions to: compute actions corresponding to the difference between a current local state of the managed devices and a target local state for the managed devices, said actions to be executed by the managed devices for bringing the current local state into compliance with the target local state; communicate the actions to the managed devices, via the local network, for execution; subsequently to said communicating instructions, monitoring current states of the managed devices, including detecting a change in the current states of the managed devices, the change reflecting the execution of at least one of the actions at the managed devices, and updating the current local state to reflect the change; compute updated actions corresponding to an updated difference between the current local state and the target local state, following said updating, said at least one executed action being absent from the updated actions; communicate the updated actions to the managed devices, via the local network.

In accordance with one aspect, there is provided a method of managing managed devices with a local computer, the managed devices and the local computer being local to a facility having at least one electric machine monitored by sensors, the electric machine having a peak power of at least 100 kW, the managed devices having at least one acquisition unit for the sensors; the method comprising: computing actions corresponding to the difference between a current local state of the managed devices and a target local state for the managed devices, said actions to be executed by the managed devices for bringing the current local state into compliance with the target local state; communicating the actions to the managed devices, via the local network, for execution; subsequently to said communicating instructions, monitoring current states of the managed devices, including detecting a change in the current states of the managed devices, the change reflecting the execution of at least one of the actions at the managed devices, and updating the current local state to reflect the change; computing updated actions corresponding to an updated difference between the current local state and the target local state, following said updating, said at least one executed action being absent from the updated actions; and communicate the updated actions to the managed devices, via the local network.

In accordance with an aspect, there is provided a local computer for managing managed devices, the managed devices and the local computer being local to a facility having at least one electric machine monitored by sensors, the electric machine having a peak power of at least 100 kW, the managed devices having at least one acquisition unit for the sensors, the managed devices configured to communicate over a local network, the local computer positioned at a boundary between the local network and a telecommunications network, the local computer configured to communicate i) with the managed devices via a local network and ii) with a remote computer via a telecommunications network, the local computer having: non-transitory memory storing executable instructions; a hardware processor that executes the instructions to: build a current local state for the managed devices including retrieving from the managed devices, via the local network, a plurality of current states of corresponding managed devices; and integrating the plurality of current states into the current local state; monitor current states of the managed devices, including detecting a change in the current states of the managed devices, and update the current local state to reflect the change.

Many further features and combinations thereof concerning the present improvements will appear to those skilled in the art following a reading of the instant disclosure.

DESCRIPTION OF THE FIGURES

FIG. 1A is an elevation view of a first example of a large electric machine;

FIG. 6 is an example schematic illustrating the synchronization process of operations for the current local state to reach the target local state;

DETAILED DESCRIPTION

FIG. 1A shows an example large electric machine which, in this embodiment, is embodied as a generator. More specifically, the example electric machine is a Kaplan-type turbine 18. As depicted, the Kaplan-type turbine 18 has a stator (not shown) and a rotor 14 which is rotatably coupled to the stator and which rotation can be driven by an incoming flow of liquid along orientation O.

Figure 1B:
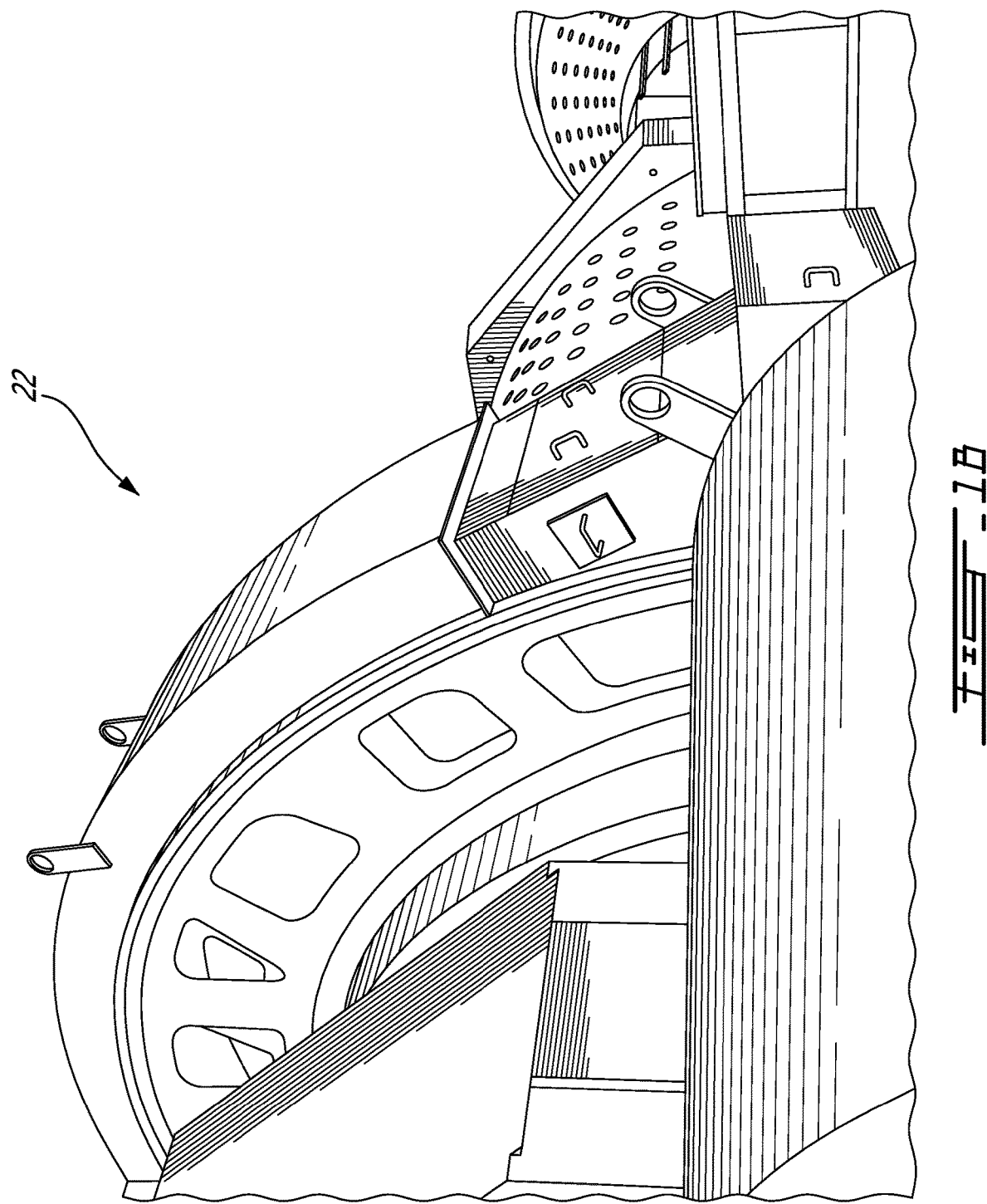
FIG. 1B is an elevation view of a second example of a large electric machine.

FIG. 1B shows another example of a large electric machine embodied here as a SAG mill 24. In this embodiment, the SAG mill has a rotor and a stator and are powered by electricity.

Figure 1C:
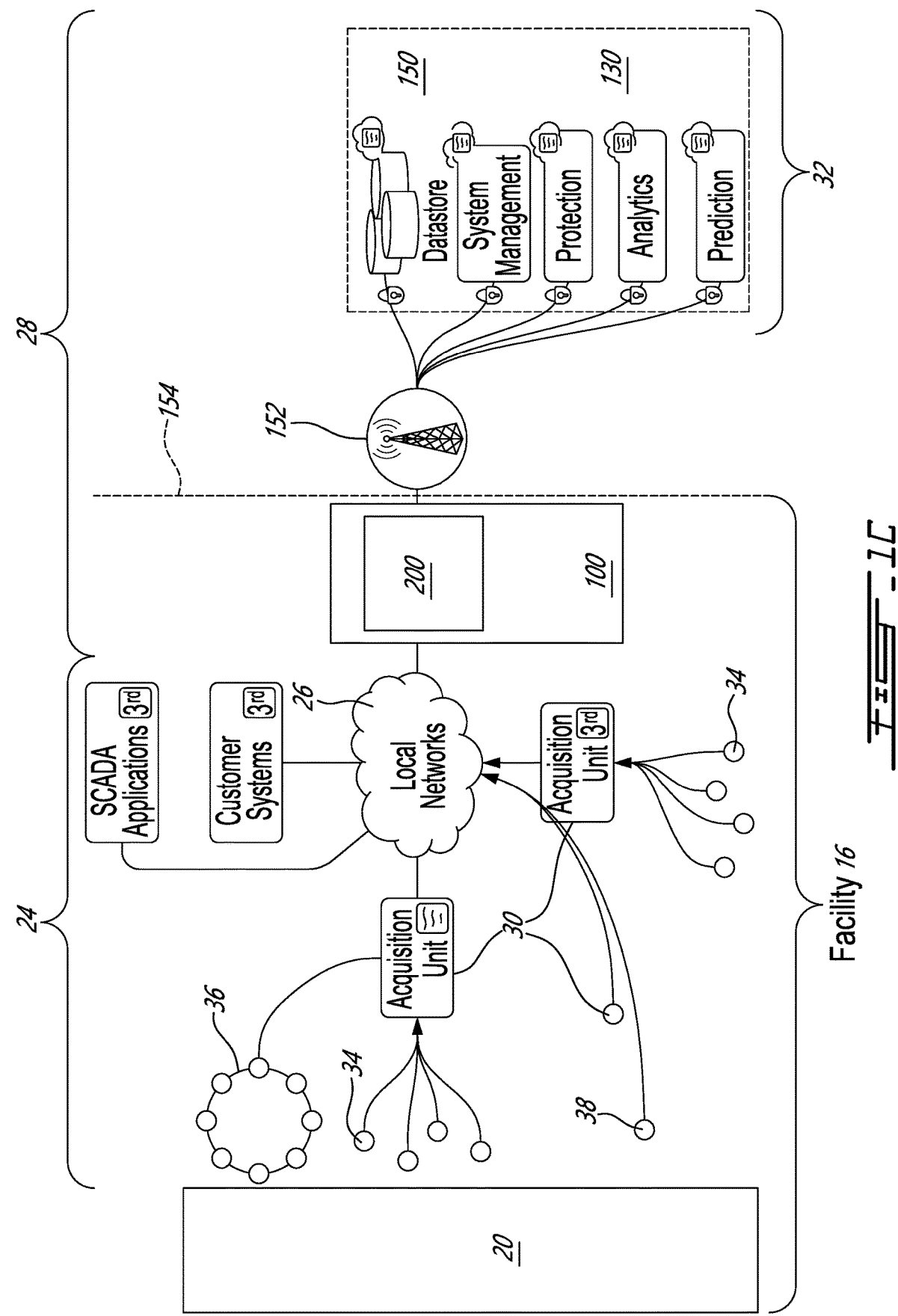
FIG. 1C is a schematic view of an example system used to manage components of monitoring equipment associated to a large electric machine.

Both the Kaplan-type turbine 18 and the SAG mill 22 are examples of large electric machines. Referring to FIG. 1C, large electric machines 20 are located at premises which will be referred to herein as facilities, and are typically equipped with elaborated monitoring equipment. A given facility 16 can have one or more electric machine 20, and each electric machine 20 can have dedicated equipment while some of the monitoring equipment can be shared with more than one machine. The expression "large" here refers to the power range, and typically also implies a relatively large volume. The power range can be indicative of a criticality of the machine, in the sense that downtime for a machine having a greater power is typically more "costly" (e.g. in terms of lost profits or other inconveniences) than a smaller power machine, making the business case of investing to reduce the likelihood or duration of downtime often easier to make than on small electric machines. A given large rotary electric machine 20 can be in the range of hundreds of kilowatts (KW), in the range of megawatts (MW), or greater, for instance, depending on the embodiment. The monitoring equipment and the electric machine(s) 20 can be local to a facility 16 such as a hydroelectrical powerplant or a mining milling plant.

FIG. 1C is includes a schematic representation of such a facility 16 having at least one electric machine 20 and monitoring equipment 24. The monitoring equipment 24 can include sensors, acquisitions units and higher level applications running on computer resources such as SCADA applications and customer systems, and one or more local network 26, all of which can have hardware located at the facility 16 of the electric machine 20.

In FIG. 1C, a system 28 is used to manage components of the monitoring equipment 24 which will be referred to herein as "managed devices" 30. The system 28 includes a manager software 200, which can run on dedicated computer hardware resources referred to herein as a local computer 100. In the illustrated embodiment, the local computer 100 can consist of a computer system having a plurality of computer units configured for communicating with one another and offering both software and hardware redundancy. In the illustrated embodiment, the local computer 100 has hardware which is distinct from the hardware of the monitoring equipment 24, local network hardware, and any other customer system, and is configured to communicate with managed devices 30 via one of the one or more local networks 30. The local network 30 via which the local computer communicates with managed devices can be of the "operational technology" (OT) type, and can operate based on Industrial Internet of Things (IIOT) technology for instance. Other local networks can be present or absent, and connected to the local computer 100 or disconnected from the local computer 100, such as an Information Technology (IT) network such as Ethernet for instance. Elements constituting the local network(s) can be wired, wireless, or hybrid.

In the embodiment illustrated, the local computer 100 is further configured to communicate with a remote computer 150 such as a cloud server via a telecommunications network 152 such as the Internet. More specifically, local network 26 can be a secure network, and the local computer 100 may be an "edge device" in the sense that it can be the only device of the local network 26 which is configured to communicate via the telecommunications network 152. As such, the local computer 100 can be positioned at a boundary 154 between the local network 26 and the telecommunications network 152. The remote computer 150 can be located at a remote location 32 which may be located tens or hundreds of kilometers away from the facility 16 for instance. The remote computer 150 can be distributed over a plurality of distinct remote locations.

In such a scenario, management of the local, managed devices 30, such as performing changes in the configurations or performing software updates, may either be performed locally, e.g. by the on-premise intervention of a technician using suitable equipment, or remotely, via the manager software 200. There are advantages and disadvantages to on-premise management vs. remote management. In particular, considering the potential criticality of the large rotary electric machine hardware and software infrastructure, security may be a high priority consideration. In some embodiments, performing management on-premise via technical personnel which is screened upon admission to the premises, can be a high security approach, whereas connecting the local network to a telecommunications network can open the door to security breaches such as via cyberattacks. However, on the other hand, on-premise management can represent a significant source of cost, especially when considering scenarios where the facilities are in remote locations and where technical personal displacement can be a particular inconvenience. Such latter aspects may lead some facility operators to limit local device management to the strict minimum, which may lead to other inconveniences. There can thus be a significant advantage to performing remote management to the extent that such remote management can be provided in a secure manner.

Depending on the embodiment, the manager software 200 can be provided in the form of a software package having different functionalities which are generally adapted to such considerations. In one embodiment, the manager software 200 can be provided with functions associated to the management of some or all of the monitoring equipment 24, local network elements, other local customer systems, and/or one or more modules running on the manager computer itself, and the latter can all be referred to as "managed devices" 30 for convenience, to refer to the point of view of the manager software 200 and of the facility 16.

The manager software can be provided in the form of computer readable instructions stored in a non-transitory memory forming part of the hardware equipment of the manager computer 100. The manager software 200 can transmit data with the remote computer 150 via a telecommunications network such as the Internet. Optionally, the manager software 200 can transmit data with other frontend applications such as SCADA applications and/or other customer systems which may be local, or, in an alternate embodiment, remote. The monitoring equipment 24 can include sensors configured to monitor the status (e.g. health) of the electric machine 20. Sensors can be provided in various forms, such as discrete sensors 34, sensor arrays 36, autonomous (e.g. wireless) sensors 38, etc. The sensors can have one or more acquisition units which can be either integrated to a sensor, such as in the case of autonomous, e.g. wireless, sensors 38 for instance, or separate from the sensor and communicatively coupled to a plurality of sensors. Acquisition units can even be provided in the form of higher level applications running on computers (e.g. SCADA applications), which may generate data.

Figure 2:
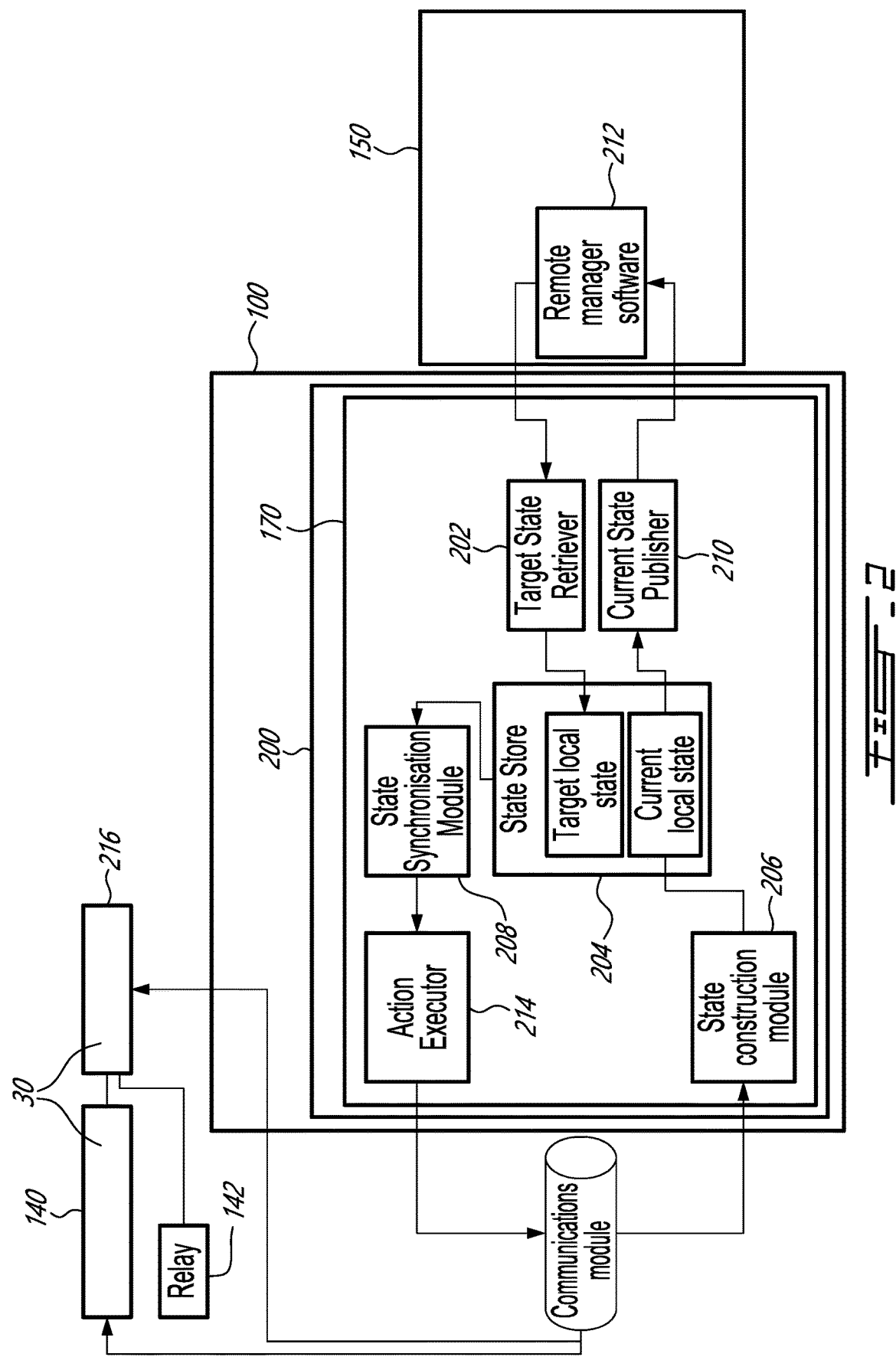
FIG. 2 is a view showing an example manager software for the system of FIG. 1C.

FIG. 2 is a block diagram showing an example embodiment where a manager software 200 runs on a local computer 100. The monitoring equipment can include additional managed devices 30 to the ones shown as examples in FIG. 1C. For example, in the embodiment presented in FIG. 2, the monitoring equipment includes a managed device in the form of an acquisition unit 140, and an other managed device in the form of an alarm engine 216 that is responsible for triggering certain alarms, according to certain rules, when certain conditions are met, or even act on other managed devices 30 such as by changing a parameter of acquisition units 140 (e.g. increasing measurement frequency when vibrations reach a certain level) or shut off one or more relay 142 controlling the operation of the machine 20 for safety purposes. Managed devices 30 can have associated attributes forming virtual instances of parameters. Attributes can be reflected in corresponding current states.

For example, in the case of the alarm engine 216, the parameters can be the rules in which the alarms are triggered and changing the parameters can involve changing the rules in which alarms are triggered. The parameters can also include actions which are triggered by corresponding alarms and changing the parameter can involve changing the actions which are triggered by corresponding alarms. In the context of acquisition units 140, for example, changing the parameter can involve changing a sampling frequency of one or more sensors, for instance, such as by increasing a sampling frequency when certain conditions are met which are indicative of a potential issue.

The manager software 200 can control data flow at a boundary 154 between the local network 26 and the telecommunications network 152. For example, the local computer 100 can provide the remote computer 150 with an entry point into the local network 26. In one embodiment, the manager software 200 has software functions adapted to translate data between protocols, formats, or languages used in the monitoring equipment 24 and a protocol, format, or language used by the remote computer 150 and/or telecommunications network 152.

The manager software 200 can have a software application or software package referred to generally as an asynchronous state management module 170. The asynchronous state management module 170 can have a function to build a data construction representing the current states of a plurality of managed devices 30 of the monitoring equipment 24. This function can be based on proactively retrieving individual current states of the managed devices 30. The data construction representing the current states of the plurality of managed devices 30 of the monitoring equipment 24 will be referred to herein as the current local state.

A current state of a given managed device 30 can include various types of data pertaining to the given managed device, such as one or more parameter elements (e.g. attributes) dictating or representing operational behavior of the managed device 30 or of an other device associated to the given managed device. For instance, a managed device current state can include an item type (e.g. schedule, rule, relation, configuration), identification (e.g. ID, serial number, device type), configuration information such as a schedule (e.g. frequency in seconds, metric names, default, creation time), a relation data (e.g. an indication of where a given managed device, e.g. sensor, is located), a configuration (e.g. JavaScript Object Notation—JSON), an operational state (e.g. hardware version, firmware version, configuration, security data, custom operational state, etc.) and information (e.g. a description, an orientation, a communication module identifier, custom device information, a note left by a technician).

The current local state can be built in a manner to include information pertaining to the current states of a plurality of managed devices 30.

Referring to FIG. 2, the manager software 200 can be configured to query the managed devices 30 for their current state and build the current local state from the current states acquired from a plurality of managed devices 30. A function of the manager software 200 which retrieves the current states and builds the current local state can be referred to as the state construction module 206. The state construction module 206 can be configured for constructing the current local state with current states of managed devices 30 which may not generate or transmit data in terms of states. To achieve this, as presented in greater detail in FIG. 3, the state construction module 206 can be provided with a plurality of drivers 310 which act as adapters to interface with different types of managed devices 30. The manager software 200 stores the current local state in non-transitory, local, computer-readable memory.

The asynchronous state management module can also have a function to retrieve a target local state from the remote computer 150 (e.g. from a software application running on a cloud-based server), and store the target local state in the local computer-readable memory.

The manager software 200 can also query a remote manager software 212 running on the remote computer 150 to retrieve a target local state for the managed devices. The target local state may pertain to only a portion of the information forming part of the current local state. In other words, the (local) manager software 200 can be configured to retrieve more data, e.g. as much data as it can acquire, from the managed devices 30, including even data which it does not know initially to be available, in a manner to allow "discovery" of relevant data either by functions included in the local manager software 200 or by functions included in the remote management software 212, for instance, such as schematized in FIG. 6.

The manager software 200 can compute a difference (which can alternately be referred to herein as a "delta") between the target local state and the current local state. The manager software computes one or more actions (operations) based on the difference between the target local state and the current local state, the operations being configured to bring the current local state into compliance with the target local state.

For example, the local manager software 200 can compute one or more operations to bring the configuration one or more given managed device(s) from the parameters represented in the current local state into compliance with parameters defined in the target local state.

It will be noted that in the context of the functionality described in the preceding paragraphs, the acquisition of the target local state and the acquisition of the current local state need not be synchronized. In other words, the target local state acquisition can be completed at a significantly different time than the current local state acquisition, such as several hours, a day, or even more than one day apart. The manager software 200 can simply be adapted to compute the difference between the target local state and the current local state when both these local states have been acquired, and to compute operations, and communicate these operations for execution, when the difference has been computed. This asynchronous mode of operation can have an advantage in some embodiments or some scenarios. For instance, the asynchronous mode of operation can provide robustness to situations where the connectivity to the remote computer 150 is temporarily lost for instance, which may be caused by failure of the telecommunications network 152 for instance. Indeed, especially in locations remote from large cities, and where large electric machines are often located, telecommunication network reliability can be a problem. The software application/package responsible for executing the operations can be referred to as the action executor 214.

It will be noted here that the manager software 200 may be configured to "refresh" the target local state and/or the current local state at any time subsequently to determining the difference, by acquiring a new current local state and/or a new target local state. The refreshing of the new current local state and/or a new target local state can take place within a certain period of time (e.g. during the same hour or during the same day), or at different moments in time (e.g. during different hours or during different days. The asynchronous state management module 170 can be configured to determine a new difference (delta) after only one of the current local state and of the target local state has been refreshed, and operations can be computed and executed based on the new difference, before the second one of the current local state and of the target local state has been refreshed. Alternately, the manager software 200 can be configured to wait until both the current local state and the target local state have been refreshed before computing a new difference and generating and/or executing operations based on the new difference.

Figure 3:
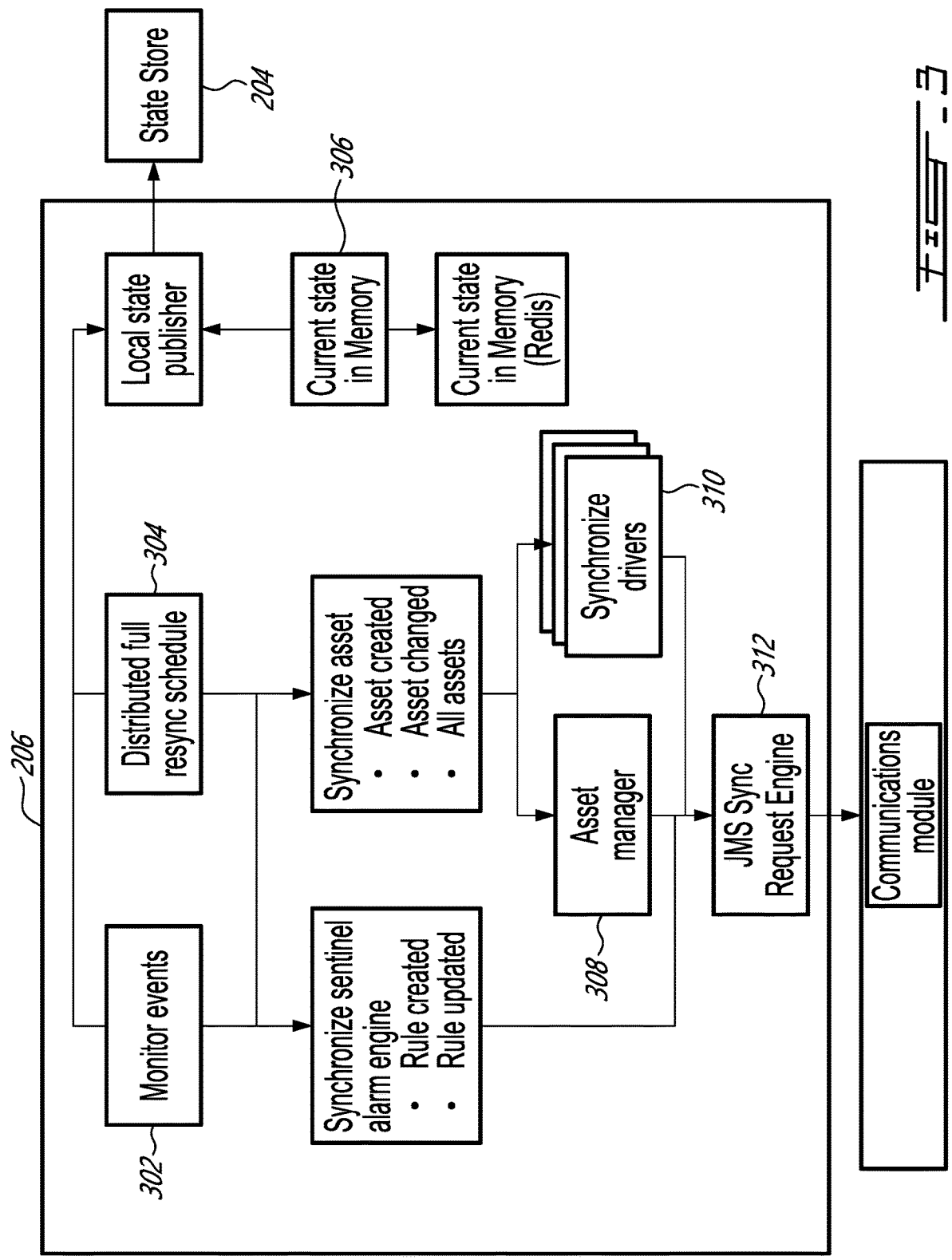
FIG. 3 shows an example state construction module for the manager software of FIG. 2.

In the embodiment presented in FIG. 2 and FIG. 3, the manager software 200 can use a communication module/messaging service (e.g. a "broker" application) to communicate operations to the managed devices and/or retrieve information therefrom. In the embodiment presented in FIGS. 2 and 3, a broker application is used both in the process of retrieving information (e.g. states) from the local computers 30, and to communicate operations to change the states of managed devices 30.

Referring back to FIG. 3, the state construction module 206 can monitor the managed devices 30 to construct the current local state. In one embodiment, the state construction module 206 can indirectly determine whether one or more actions have been executed based on the detection of a change in the state of the managed device 30, and/or upon computing the new "difference", or "delta", between the updated local appliance state and the target local state. The manager software 200 can query the managed devices 30 for their current states and then construct the updated current local state from the updated current states of the managed devices 30. The updated current state of the managed device 30 can indirectly reflect which operations have been implemented by the managed device 30, as the results of such operations can correspond to a change in one or more parameters. The manager software 200 can compute an updated difference between the target local state and the updated current local state for the managed device 30. The manager software 200 can determine which of the operations were executed based on the updated difference between the current local state to the target local state.

The manager software 200 may continue to operate on certain functions even when connectivity to the remote computer 150 is not available, using local computing capabilities. However, other functions of the manager software can be configured to operate in relationship with the remote computer 150, which may require connectivity to the remote computer 150 at some points in time. Such functions may tolerate limits in connectivity through the telecommunications network, either in terms of frequency or duration of connected time periods. For example, the manager software 200 can use connectivity to retrieve the target local state from the remote computer 150. The manager software 200 may also communicate information contained in the current local state to remote management software 212 via said connectivity for instance, and the remote management software 212 can be configured to generate the target local state, to a certain extent, based on the information received from the local manager software 200. However, functions associated with building the current local state and to push actions/operations to the managed devices 30 may be configured to operate independently of cloud connectivity. When able to connect, the manager software 200 can have a function configured to further transmit notification messages to the remote computer 150, such as a notification indicative that pushed actions have not properly converged after a successive amount of attempts, for instance, or that pushed actions have been detected to have been correctly executed as may have been detected by a comparison between an updated current local state and the target local state.

The manager software 200 can asynchronously manage a managed device state in order to provide resilience to cloud connectivity issues. In some embodiments, the current local state can include information about the current state of the local computer 100 itself, and the local computer 100, or more specifically one or more modules thereof, can thus also act as a managed device 30 and operate on itself.

The overall system architecture, including the respective roles of the manager software 200 and of the remote manager software 212, can simplify the management of distributed and heterogeneous managed devices 30. Indeed, remote management software 212 running for instance on a cloud server can be configured to communicate with a large number of facilities each having monitoring equipment monitoring large electric machines, with each facility having one (or more) manager computer 100 running a version of the manager software 200, and a heterogeneous variety of managed devices 30 included as the monitoring equipment 24. The overall system architecture can target either one, or both, of i) the potentially large number and potential heterogeneity of the manager computers 200 forming edge devices of a correspondingly large number of facilities, and ii) the potentially large number of different models and types of managed devices 30 in different ones of the facilities. Moreover, the overall system can take into account the likelihood that different ones of the monitoring equipment at different facilities will evolve and change over time, such as by adding, removing, or changing individual ones of the managed devices 30, as can be expected to occur relatively frequently in practice.

The manager software 200 can be designed to rely solely on communications incoming from the remote management software/from the telecommunications network 152, which it has previously specifically requested, and to reject any incoming communication which is not interpreted as a reply to a specifically formulated request. Requests to receive communications from the remote computer 150 can be referred to as queries, and any incoming communication from the telecommunications network 152 may be received contingent upon matching the incoming communication with a previously issued query, and otherwise rejecting the incoming communication. Relying solely on incoming communications which have been specifically requested can be a way providing security against eventual potential unsolicited access and/or piracy. Similarly, the manager software 200 can be designed to rely solely on communications incoming from managed devices 30 when such communications are positively associated to a query.

In accordance with an embodiment, the system architecture can leave it to the managed devices to be at least partially responsible for determining which operations can be executed, and for executing those actions. Accordingly, the update operation execution module can be focused on computing which actions/operations will lead to closing the gap between the current local state and the target local state, and such operations, once computed, can be communicated to the managed devices 30 in any order, leaving it to the managed devices 30 to execute the operations which they can currently execute amongst the operations communicated to them by the manager software 200. An update to the current local state for instance, and updating the difference between the updated current local state and the target local state, for instance, can provide a means to determine which operations have indeed been executed by the managed devices 30 in a given iteration, and such actions can be absent from the next batch of operations communicated to the managed devices 30 for execution. Accordingly, the determination of whether the action can be taken at the current time can be left to the managed device 30.

The manager software 200 can operate iteratively, updating the current local state after each round of communicating the operations to the managed devices 30, re-computing the difference between the local state, determine the required operations, and send another round of operations. Accordingly and typically, in each subsequent round, the number of operations can be reduced. An operation concerning a given managed device 30 which could not be implemented in the first round because it required another operation to be performed first may then become implementable from the point of view of the managed device 30, which then implements it, until all operations have been implemented, or until a certain number of rounds or unsuccessful attempts have been performed for instance (in which case a message concerning the failure may be communicated to the remote management software 212 at the remote computer). Such a process can be more robust, for instance, than having an action executor 214 determining the order of operations to be performed for each managed device 30, as it can remove or reduce the likelihood of error associated to the determination of the order and thereby limit the potential errors to ones where the operations cannot be implemented for other reasons than by reason of the order of operations.

Indeed, the updated set of actions may remove some actions from the previous set of actions, and the remaining actions can then pushed to the managed devices 30 by the action executor 214. Eventually, by repetition, the correct order of actions can be achieved and all actions can be implemented, in the absence of a particular issue which can be detected and communicated to the remote management software by the local management software. For example, an action X may be dependent on another action Y in the set of corrective actions. In the first iteration/pass, the managed device may execute the action X, ignoring action Y which is determined to not be executable at the current time, and in the second pass/iteration, the managed device can then execute the action Y that was dependent on the executed action X. In such an embodiment, the local management software 200 is not required to determine an order of the operations/actions to be executed by corresponding ones of the managed devices 30. In the event where it is detected that a given operation/action has not correctly been executed and certain conditions are met, the manager software 200 can have a function to transmit a notification message to a remote computer 150 indicative of this failure to apply the target local state for a given managed device (or more). Such a notification message may be triggered based on a given amount of attempts/iterations having been met, or based on a given amount of time having elapsed since a given attempt. The notification message can also be held in memory until cloud connectivity is established.

The orderless update scheme can provide versatility particularly for scenarios where some (or all) of the managed devices 30 are from different suppliers and have not, a priori, been made inherently adapted to the manager software 200, (other than, in an embodiment, by the integration of suitable drivers upstream of the communication module). The manager software 200 can use different drivers 310 to communicate with different types of managed devices 30. The manager software 200 can manage devices from different suppliers by using the different drivers to retrieve data from the different types of managed devices 30.

Referring back to FIG. 2, in the illustrated embodiment, the manager software 200 has a target local state retriever 202 which is a software function responsible for retrieving the target local state from the remote manager software 212, and stores the target local state in the state store 204. The manager software 200 has a current state publisher 210 that publishes the current local state to the remote manager software 212. The current state publisher 210 retrieves the current local state from the state store 204.

In the illustrated embodiment, the manager software 200 has a state construction module 206 for computing or building the current local state from data acquired from the managed devices, and storing the current local state in the state store 204.

In the illustrated embodiment, the manager software 200 has a state synchronisation module 208 which is another software function, charged with computing the difference between the target local state and the current local state. In some embodiments, the state synchronisation module 208 determines one or more corrective actions to bring the current local state into compliance with the target local state. In the illustrated embodiment, the manager software 200 has an action executor 214, which is another software function charged with executing the one or more actions/operations computed by the state synchronisation module 208. It can execute the one or more actions by pushing the one or more actions to the managed devices 30 via a communications module (broker).

After pushing a set of actions, in some embodiments, the state construction module 206 computes an updated current local state and stores the local current state in the state store 204. The appliance state synchronisation module 208 computes an updated difference between the target local state and the updated current local state. The manager software 200 can use the updated difference to indirectly detect which corrective actions have been executed by the managed devices 30, and which actions are to be pushed anew.

The management software 200 can bring the managed devices 30 to the target local state by computing and executing corrective actions. The management software 200 can maintain the target local state at the managed devices 30. A declarative approach for deployed managed devices can make state management more scalable. This declarative approach can further accommodate specific use cases where cloud connectivity is temporarily unavailable and in which case an indirect communication link could be used. By maintaining a weak coupling with the remote computer 150, the declarative approach of the management software 200 can provide additional system robustness, more specifically in the case of error handling and state management.

To promote robustness, the management software 200 can be stateless (does not maintain a state). When a program is stateless or when the infrastructure of a system prevents a program from maintaining state, it cannot take information about the last session into the next, such as settings the user chose or conditions that arose during processing, and thus does not make use of "hard" memory. The fact that the management software 200 can be configured to compute the current local state at any time allows the service to be stateless, as the state is not a construct of the past, but it can be retrieved as a whole without additional context. In other words, the system can be configured in a manner that if the local computer responsible running the managed management software 200 is powered off, or is otherwise reset, the non-transitory computer-readable memory of the state store 204 can be entirely deleted, and filled back up again by retrieving the current local state by interrogating the managed devices 30, and retrieving the target local state from the remote computer 150.

The current local state can be defined by different attributes representing virtual instances of parameters of the managed devices. For example, attributes of the current local state can include rules for alarms and conditional measures. As another example, attributes of the current local state can include drivers or schedules for devices. The drivers for managed devices can include identification information (e.g., serial number or identifier), firmware information, configuration files, asset information (e.g., contextualisation, hardware version), and so on.

In one embodiment, the current local state can provided in the form of a list of items with a checksum of the items. The last update time and last full resync time can provide insight about the quality of the data representing the current local state (e.g. if the current local state is old then may be stale or if more recent may be more accurate). As the information is consolidated by the state construction module 206 from multiple sources and can happen concurrently, the state construction module 206 can store incoming data about the current states in a database with transactions for each system synchronization. Another way would be for the state construction module 206 to use a distributed lock for any synchronization. The synchronization for each service (drivers or others) can be implemented in a dedicated module. The management software 200 can be updated to support a new driver and the synchronization specific to a driver. The management software can be configured to support, out of box, generic functionalities of a new driver.

The current local state can include data sets of different data elements. A current local state model can define the state using different data sets. For example, the current local state may be defined as: list of items; checksum; last update time (e.g. time when the last update occurred); last full resync time (e.g., time when the last full resync occurred), and so on. A change in a data element can result in a change to the overall state.

Each item of the state can be defined by a data set. For example, an item may be defined as: type (e.g. schedule, rule, asset type, relation, configuration); identification; data; last update time; checksum of data.

The identification of an item may be defined by a data set. For example, an identification may be defined as: identifier; serial number; device type. The schedule for computing the current local state may be defined by a data set. For example, the schedule may be defined as: frequency in time metrics; metric names; default; creation time. A relation may be defined by a data set. For example, a relation may be defined as: relate to link; type; relative position.

An asset may be defined by a data set. For example, an asset may be defined as an operational state and information. The operational state may be defined as: hardware version: string; firmware version: string; configuration: identifier; security: enabled/disabled; commissioned: true/false; custom operational state. The information for an asset may be defined as: description; orientation; communication module (device type specific); metric range or list (propertyType; minValue; maxValue; unit); and any custom device information (e.g. associated assets).

The current local state and the target local state can contain different categories of information. One category of information relates to the object information containing all read only information from the point of view of the remote computer 150 (e.g. the metric range of the asset driver). Another category of information relates to the object operation state regrouping all elements which can be operated on. Example elements include: the asset firmware version; the assets communication module; the default schedule; the alarms rules; and so on.

The manager software 200 connects to a remote computer 150 which has a remote manager software 212. The management software 200 has different components, such as an current local state retriever 202, current local state store 204, state construction module 206, current local state synchronisation module 208, and current local state publisher 210. The different components of the management software 200 can be asynchronous and work independently from each other. For example, even if the manager software 200 does not have connectivity to the remote manager software 212, the manager software 200 can apply the management process to the managed devices 30 as long as it has had a chance to retrieve the target local state. The manager software 200 can have an in-memory storage (state store 204) to store the current local state and the target local state. The current local state and target local state can be in non-persistent (soft) memory, or in persistent (hard) memory depending on the application, and both states can be retrievable. This further enables the various processes to operate in an asynchronous manner. The arrows in FIG. 2 show data flow between the components of the system.

The current state publisher 210 can be responsible for pushing data concerning the current local state to the remote computer 150. The data can be acquired from the state store 204. The remote manager software 212 can determine a local target local state for the premises taking into consideration the data concerning the current local state. The target local state retriever 202 can be responsible for retrieving the target local state. The target local state retriever 202 can positively query the remote computer 150 about the target local state for the premises. The remote manager software 212 can communicate the target local state in response to the query. The target local state retriever 202 can ignore any communication which is not explicitly tied to the query. Once retrieved, the target local state can be saved in the (local) state store 204. The processes performed by the target local state retriever 202 and bay the current state publisher 210 can operate independently, and thus asynchronously, from one another. The processes can be performed periodically at different time periods (e.g. using Remote Procedure Calls application programming interface). The time period can be different for each of the current local state retriever 202 and the current local state publisher 210.

FIG. 3 shows an example state construction module 206. As noted, the managed devices may not communicate directly their current state (e.g. they may not use state communication or messages), but instead may communicate different types of data that can be used to compute a representation of state using an appropriate software function. The state construction module 206 can query various monitored devices (for current states and data) to build the whole current local state.

The state construction module 206 can be responsible for querying the managed devices for current states and building the current local state therefrom, and storing the current local state in the (local) current local state store 204. The state construction module 206 is responsible for retrieving the current local state. The state construction module 206 can query various systems to build the whole current local state (from the retrieved individual current states) and publish or store the current local state to the current local state store 204. In order to avoid numerous, unnecessary queries, in some embodiments, the management software 200 may implement a checksum mechanism used in conjunction with services the state construction module 206 is synchronizing with. The state construction module 206 may be partially stateful. In some embodiments, for better performance, the state construction module 206 can monitor the managed devices for changes in their individual states. This can be performed by comparing individual states to corresponding states stored in a memory dedicated to the state construction module. For reasons of resource efficiency, on a more regular basis, the management software can be configured to react to detected changes in the individual states, whereas the entire reconstruction of the current local state can be left to rarer occasions. In an alternate embodiment, changes can be detected by updating the current local state and detecting the change between the updated current local state and the previous current local state for instance.

Other than being configurable to track the detection of intended actions which have been correctly executed, the state construction module 206 can monitor eventual individual state changes which do not correspond to the target local state, or which may otherwise be undesired or unintended. In response to the detection of unintended changes in the individual state of one or more managed device, the manager software can be configured to take action, such as pushing instructions to correct the change of state (e.g. via the action executor 214) or advising the remote manager software 212 (e.g. via the current state publisher).

For security purposes, the individual states of the managed devices can also be proactively retrieved by the management software 200 at the local computer 100. In this manner, the management software 200 can be configured to ignore any incoming requests that are unsolicited which can improve security. More specifically, the management software 200, or the local computer 100, can be devoid of any endpoint which would otherwise enable it to receive unsolicited requests (e.g. when a server is not defined). The process operations can all be initiated by the local computer 100. For example, the local computer 100 can be configured to initiate all requests for target local states from the remote computer 150. As the local computer 100 knows what data it is requesting and when the request is transmitted it can ignore other communications. Unsolicited communications are more likely to be spoofed so this approach can improve security risks of spoofed messages.

The management software 200 can implement error handling. Failure to reach a target local state can occur for different reasons and the management software 200 can try to identify the reasons for error(s). For example, the management software 200 can flag when a specific (target) state failed to be reached after a given time period or retry attempt. The management software 200 can send a notification message to the remote computer 150 when a target local state is not reached, for example.

Logs from the services running on the managed device or appliance can be published (e.g. to the current local state store 204) which can be used to provide information on the appliance. Additionally, periodic publication of the current local state can provide insight (to the remote manager software 212) that a certain target local state is not reached within conditions where it would otherwise have been expected to have been reached. The current state publisher 210 can provide data about the current local state state to the remote manager software 212.

The manager software can be collaborative (e.g. rely on managed devices for data and actions) and fire an event after a few attempts or times to reach a desired or target local state. The manager software 200 can also keep track of commands that are failing to enable the manager software 200 to publish root causes of failure and detect unexpected or undesired behaviors.

The state construction module 206 maintains the state of the local sensor subsystem up to date. This can enable the current local state publisher 210 to respond with the requested current local state (as an up-to-date current local state) to the remote computer 150. Detecting an update in the current local state can serve as a trigger for the publisher to push that new current local state to the cloud.

The state construction module 206 can be responsible for retrieving the current local state. In some embodiments, in order to avoid numerous, unnecessary queries, the state construction module 206 can take advantage of events and make localised queries. However, in some embodiments, to be more resilient, the state construction module 206 can also periodically do a full resynchronisation, i.e. entirely delete the previous version of the current local state and reconstruct it via data acquired from the managed devices (and possibly other devices as well). The current local state can be in the form of a dataset of data elements that represent the current state of the local sensor subsystem. The current local state can be built or constructed using different current states or data from different devices of the facility.

In an embodiment, the state construction module 206 has two modes of operation: a first mode can be referred to as "monitor events" 302; and a second mode can be referred to as "full resync" 304. In the first mode, monitor events 302, the state construction module 206 can update the current local state periodically as it detects successive changes in the states of the managed devices (and possibly other monitored devices). In the second mode, full resync 304, the state construction module 206 can fully synchronize managed devices by producing the entire current local state anew. As the state construction module 206 builds the current local state anew, the state construction module 206 can store an evolving version of the current local state under construction in memory 306.

In some embodiments, the state construction module 206 implements a synchronisation process. The state construction module 206 has a second mode that can be referred to as full resync 304. In the full resync 304, the state construction module 206 can fully synchronize managed devices by producing the entire current local state anew. As the state construction module 206 builds the entire current local state, the state construction module 206 stores an evolving version of the current local state under construction in memory 306. In some embodiments, the state construction module 206 implements full synchronization (e.g. full resync 304). In some embodiments, the state construction module 206 implements partial synchronization.

For a full synchronization (e.g. full resync 304), the state construction module 206, via drivers, can query all managed devices, and query all schedules. The expression "asset" is used in this specification to refer to a virtual instance of a managed devices in this context. The state construction module 206 can have an asset manager to manage the query for all assets. The state construction module 206 can have an alarm engine 216 that queries all rules to determine whether to trigger alarm notifications The alarm engine 216 is an example of a managed device. In some embodiments, the alarm engine 216 can be integrated in the local computer 100, and in other embodiments the alarm engine 216 can be separate therefrom. For partial resynchronization, the state construction module 206, on an asset updated event, queries the asset on the driver and the asset manager. On an asset created event, the state construction module 206 queries that asset on the driver and asset manager.

The current local state can include controllable parameters for which the management software 200 has control authorisation. The current local state can include parameters which can only be read, and thus not controlled. Parameters which cannot be read may exist and not be reflected in the current local state. The state construction module 206 can build the current local state as complete as possible based on the available level of access.

In this embodiment, a synchronize asset manager 308 can store data entered by a user, such as, for example, staff responsible for installing the devices. The synchronize asset manager 308 stores data that includes contextual information for some of the assets, such as the location of a given sensor, and so on.

Synchronize drivers 310 are software for interfacing with different assets (managed devices) and acquiring information that allows the state construction module 206 to build the corresponding portion of the current state from the acquired data.

Other services can include a communications module, for example. The communications module can be a broker, a messaging service or aggregator that relays messages (e.g. actions) between the local manager software and managed devices. For example, the broker can be implemented using Artemis™ software. The broker can be configured to transfer messages to different applications. Each application can define the API which specifies the structure of the messages which it is able to receive.

The state construction module 206 has components for creating messages, such as the synchronize alarm engine, synchronize asset manager 308, synchronize drivers 310, and current state memory 306. In this embodiment, the Java messaging service (JMS) 312 synchronizes the transmission of messages. The JMS messaging service 312 can transmit messages to other services. In some embodiments, the JMS messaging service 312 considers its messaging job to be complete when the communications module acknowledges receipt, and can be considered a client of the communications module. The communications module (e.g. broker) then can implement the message tracking.

Figure 4:
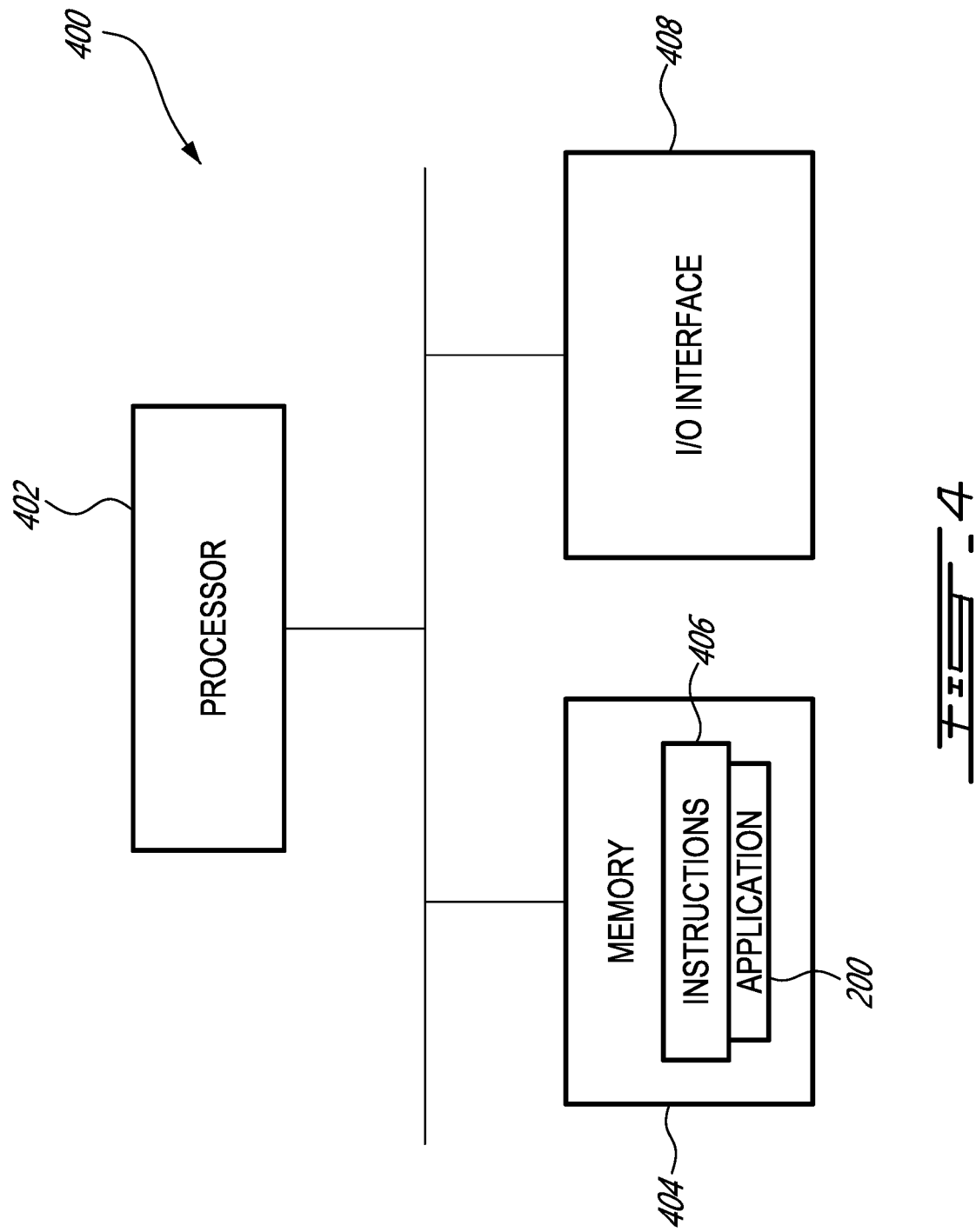
FIG. 4 shows example hardware components for implementing operations of the manager software of FIG. 2.

FIG. 4 shows example hardware components 400 for implementing operations of the local computer hosting the local management software.

For example, the local computer 100 can be implemented by hardware components 400 such as at least one hardware processor 402, non-transitory memory 404 (storing executable instructions 406 for management software 200), and at least one I/O interface 408.

Memory 404 may include a suitable combination of any type of computer memory that is located either internally or externally such as, for example. The I/O interface 408 enables local computer 100 to interconnect with one or more input devices, such as a keyboard, mouse, camera, touch screen and a microphone, or with one or more output devices such as a display screen and a speaker. The I/O interface 408 can also be responsible for communications with external components such as managed devices via a local network, or the remote computer via a telecommunications network such as the Internet. The I/O interface 408 can include at least one network interface to enable the local computer 100 to communicate with other components, to exchange data with other components, to access and connect to network resources, to serve applications, and perform other computing applications by connecting to a network (or multiple networks) and remote computer 150 (such as a cloud server).

The methods and systems of the present disclosure may be implemented in a high level procedural or object oriented programming or scripting language, or a combination thereof, to communicate with or assist in the operation of a computer such as the local computer or the remote computer. Alternatively, the methods and systems described herein may be implemented in assembly or machine language. The language may be a compiled or interpreted language. Program code for implementing the methods and systems described herein may be stored on a storage media or a device, for example a ROM, a magnetic disk, an optical disc, a flash drive, or any other suitable storage media or device. The program code may be readable by a general or special-purpose programmable computer for configuring and operating the computer when the storage media or device is read by the computer to perform the procedures described herein. Embodiments of the methods and systems described herein may also be considered to be implemented by way of a non-transitory computer-readable storage medium having a computer program stored thereon. The computer program may comprise computer-readable instructions which cause a computer, or more specifically the processing unit 402 of the computing device 400, to operate in a specific and pre-defined manner to perform the functions described herein.

Computer-executable instructions may be in many forms, including program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments. The technical solution of embodiments may be in the form of a software product. The software product may be stored in a non-volatile or non-transitory storage medium, which can be a compact disk read-only memory (CD-ROM), a USB flash disk, or a removable hard disk. The software product includes a number of instructions that enable a computer device (personal computer, server, or network device) to execute the methods provided by the embodiments.

The embodiments described herein are implemented by physical computer hardware, including computing devices, servers, receivers, transmitters, processors, memory, displays, and networks. The embodiments described herein provide useful physical machines and particularly configured computer hardware arrangements. The embodiments described herein are directed to electronic machines and methods implemented by electronic machines adapted for processing and transforming electromagnetic signals which represent various types of information. The embodiments described herein pervasively and integrally relate to machines, and their uses; and the embodiments described herein have no meaning or practical applicability outside their use with computer hardware, machines, and various hardware components. Substituting the physical hardware particularly configured to implement various acts for non-physical hardware, using mental steps for example, may substantially affect the way the embodiments work. Such computer hardware limitations are clearly essential elements of the embodiments described herein, and they cannot be omitted or substituted for mental means without having a material effect on the operation and structure of the embodiments described herein. The computer hardware is essential to implement the various embodiments described herein and is not merely used to perform steps expeditiously and in an efficient manner.

Figure 5:
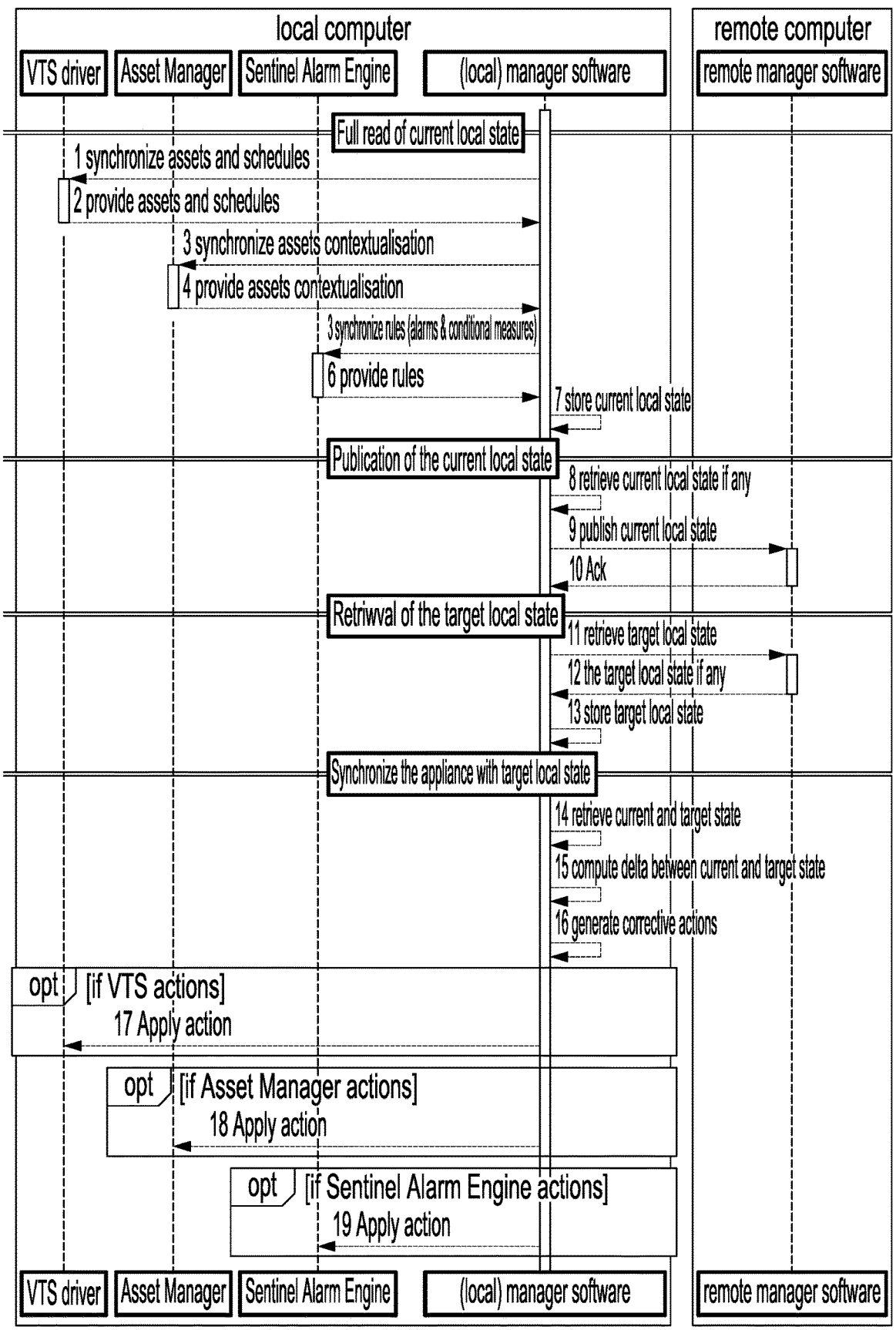
FIG. 5 shows an example flow chart diagram of operations of the manager software of FIG. 2.

FIG. 5 shows an example flow chart diagram of operations of a process for asynchronous state management that can be implemented at the local computer 100 in accordance with one example embodiment. The local computer 100 implements a full read of the current local state by a set of operations. At 1, the local computer 100 synchronizes assets and schedules. At 2, the local computer 100 provides assets and schedules. At 3, the local computer 100 synchronizes asset contextualization, and at 4, the local computer 100 provides the asset contextualization. At 5, the local computer 100 synchronizes rules (e.g. alarms and conditional measures), and, at 6, the local computer 100 provides the rules. At 7, the local computer 100 stores the current local state in memory. The local computer 100 implements publication of the current local state by a set of operations. At 8, the local computer 100 retrieves the current local state (if any). At 9, the local computer 100 publishes the current local state to the remote manager software 212 (at the remote computer 150). At 10, the local computer 100 receives an acknowledge message from the remote computer 150. The local computer 100 implements retrieval of the target local state by a set of operations. At 11, the local computer 100 retrieves the target local state from the remote manager software 212 (at the remote computer 150). At 12, the local computer 100 receives the target local state (if any) from the remote manager software 212 (at the remote computer 150). At 13, the local computer 100 stores the target local state in memory. The local computer 100 initiates a synchronization of the managed devices with the target local state by implementing a set of operations. At 14, the local computer 100 retrieves the current local state and target local state from memory. At 15, the local computer 100 computes the delta or difference between the current local state and target local state. At 16, the local computer 100 generates corrective actions. At 17, the local computer 100 applies actions to the managed devices using drivers and the communications module. At 18, the local computer 100 applies actions to one or more modules of the manager software itself (e.g. a module acting as an asset manager). At 19, the local computer 100 applies actions to the alarm engine.

FIG. 6 is an example schematic illustrating the synchronization process of required operations for the current local state to reach the target local state. The state synchronization module 208 and the action executor 214 implement corrective actions to match the current local state with the target local state provided by the remote computer 150.

As noted, the current local states describing the local and target local state contain different categories of information. One category of information relates to the object information containing all read only information, and another category of information relates to the object operation state regrouping all elements which can be operated, in other words, parameters which can be acted upon.

In a one approach, the state synchronization module 208 does not delete elements not present in the target local state. This can allow for items to be discovered by the manager software. The manager software can enforce that the target local state is a subpart of the current local state. Asset (e.g. managed device enumeration) deletion can be done with another mechanism.

Figure 7:
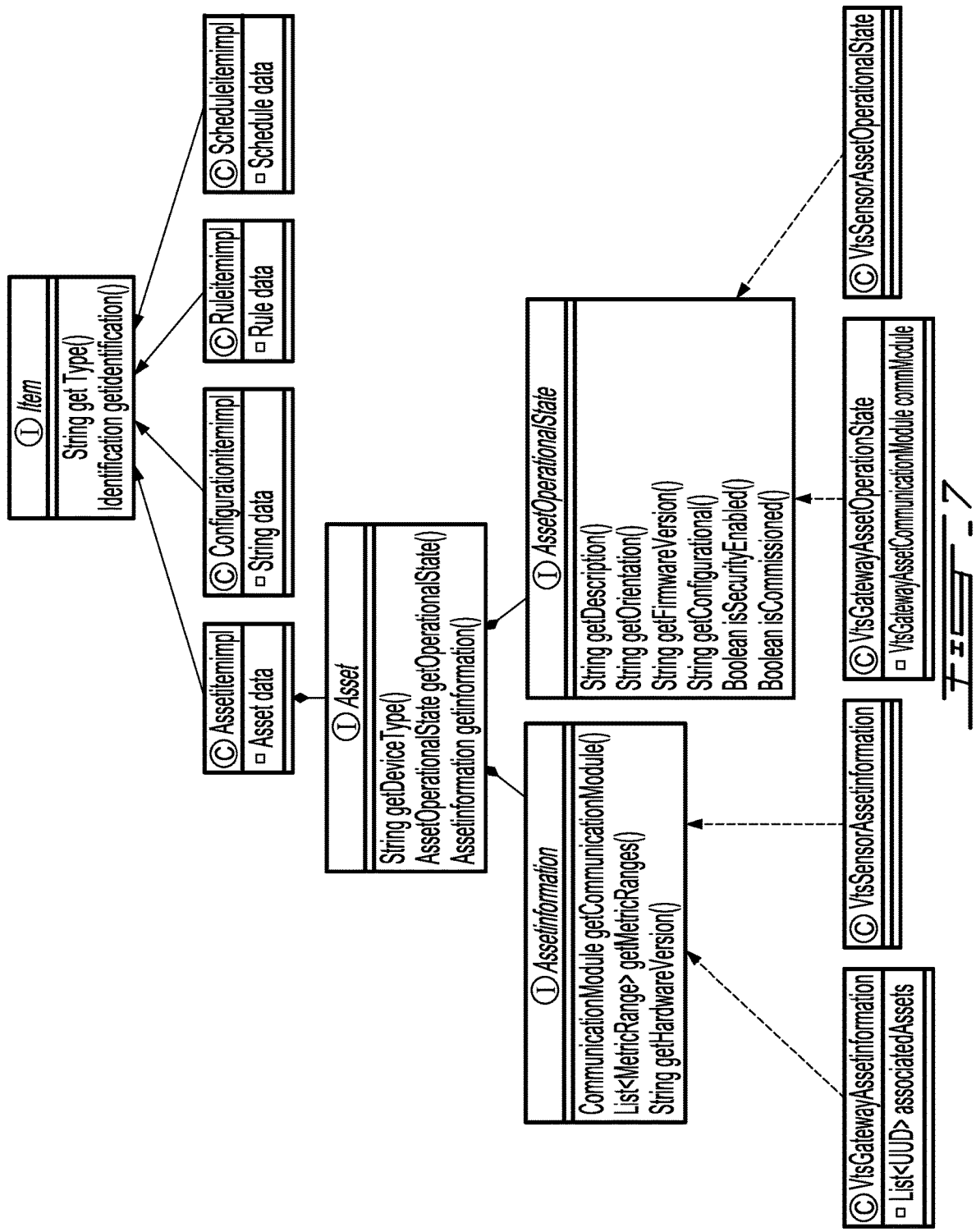
FIG. 7 is a view of an example data model for the manager software of FIG. 2.

FIG. 7 is a view of an example data model which can be used in the embodiment presented in FIG. 5. As shown, the data model defines different objects or classes and related functions or queries to retrieve data about the objects or classes. For example, an item has an identification and a type. The item data can be retrieved using functions. The item can be defined by asset data, configuration data, rule data, and schedule data. Accordingly, an item can be an asset, configuration, rule and schedule. As another example, an asset can have a device type, operational state, and information. The asset data can be retrieved using associated functions. The asset information can have different data elements, such as communication module, metric range, and hardware versions. The asset information can be defined by different types of asset information such as gateway asset information and sensor asset information. The asset operational state can have different data elements, such as description, orientation, firmware version, configuration identification, security features, and commissioned data. The asset operational state can be defined by different types of asset operational states such as gateway operational states and sensor operational states.

Figure 8:
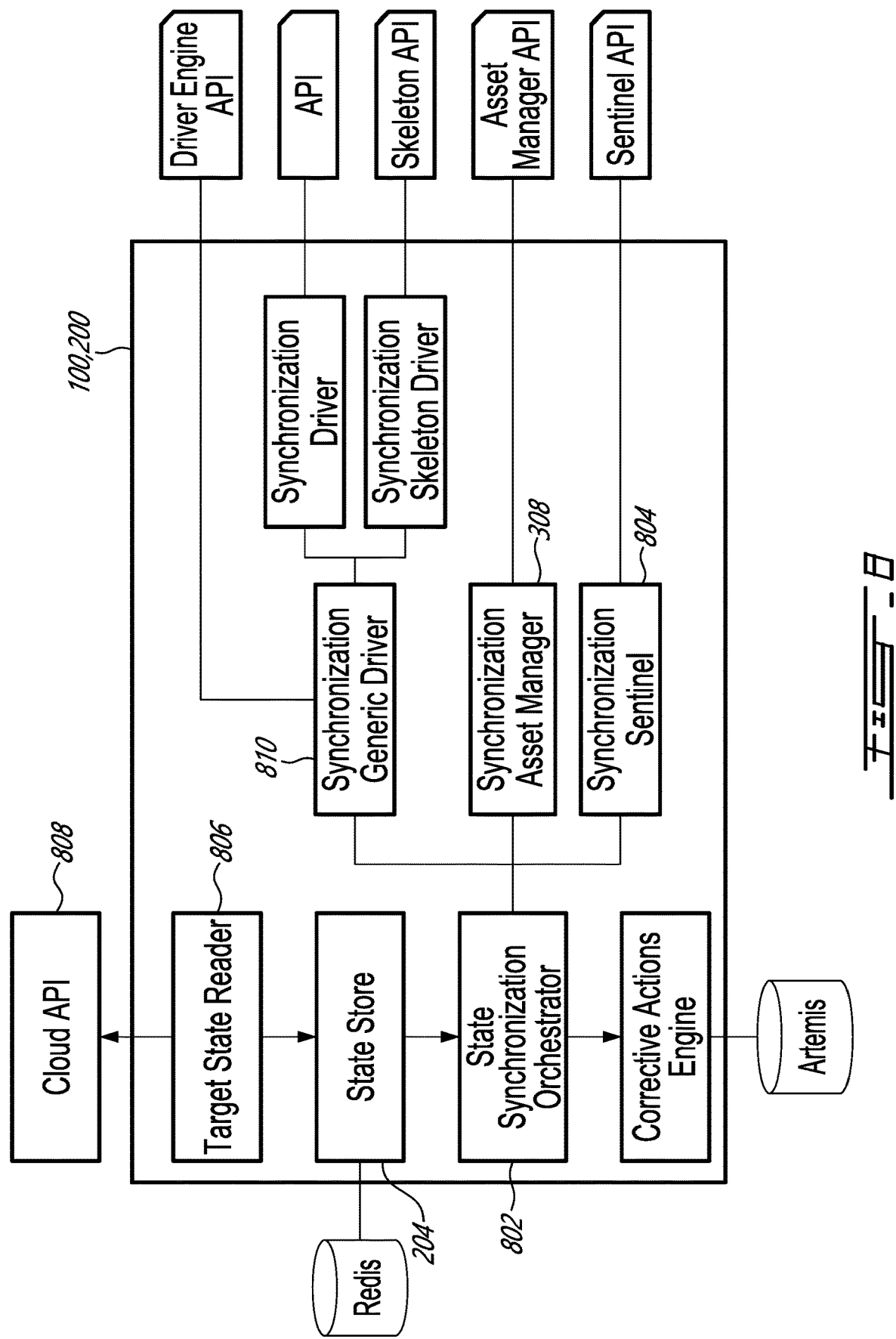
FIG. 8 is a schematic of an example component diagram of the manager software according to an embodiment.

FIG. 8 is a schematic of an example component diagram of the local computer 100 (with the management software 200) according the example embodiment presented in FIG. 5.

The state synchronization orchestrator 802 orchestrates the generation of the delta between the current and the target local states. The synchronization application specific sentinel module 804 can provide the specific (corrective) actions required to achieve the target local state on a given family of applications. The current local state store 204 stores the local target and current states. Depending on the embodiment, the drivers can require application level specification whereas the sentinel and asset manager can stay at level one and have only one implementation, and therefore not require application level specification.

In one embodiment, the target local state reader 806 can be a Remote Procedure Calls (RPC) client permitting to retrieve the target local state from the cloud application programming interface (API) 808 that communicates with the remote computer 150. In another embodiment, the target local state reader 806 can be a representational state transfer (REST) api.

All synchronization modules can contribute to the list of corrective actions to apply. This means an item can result as more than one action from more than one application. For example, updating an asset item can result in a request on a driver and a request on the asset manager.

In some embodiments, the management software 200 (at the local computer 100) does not hardcode requests sequencing. All requests should be emitted without considering their ordering. The management software 200 can keep trying periodically to close the gap between target and current state to finally reach the desired state. As an illustrative example, consider operations A, B and C to be performed. The following is an example sequence:

Sync 1: A1 (fail), B1(pass), C1(fail)
Sync 2: A2(fail), C2(pass)
Sync 3: A3(pass)

As shown, the local computer 100 can have a synchronization (generic) driver 810 that can connect to different types of synchronization drivers to communication using different APIs to push actions to different types of devices. However, it should be considered that sometimes all actions cannot be generated at once. For example a virtual instance of a managed device (which can be referred to as an asset herein) may need to be created before having its identifier for commissioning the asset driver:

Sync 1: the synchronization drivers 810 generates only the request to create the assets
Sync 2: the synchronization drivers 810 generates a commissioning request.

This mechanism can permit the core functions of the management software 200 to not have to maintain application specific logic. The management software 200 can act as a gateway between cloud applications and managed devices.

In some embodiments, the management software 200 does not validate data used to generate the requests. The modules handling those requests can have the adequate validations. Those validation operations do not have to be implemented by the management software 200. If a request is rejected for validation reasons, the monitoring systems can permit catching it in order to correct the target local state emitted by the remote computer 150.

To ease this process, the management software 200 error codes can be refined to differentiate error causes. The management software 200 can be configured to ensure the target local state respects the expected format.

Figure 9:
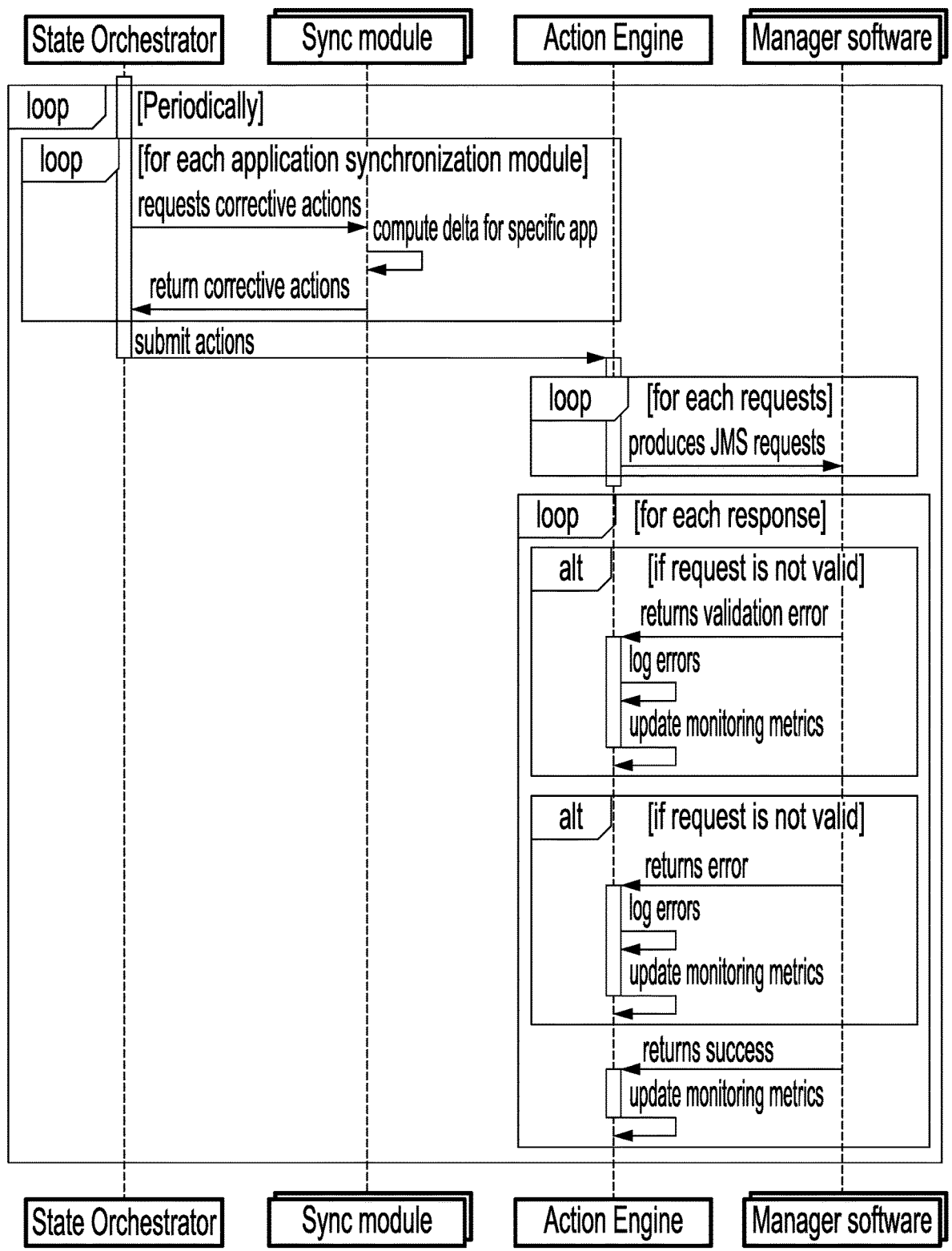
FIG. 9 is a flowchart diagram of a process for state delta computation and of the processing of corrective actions.

FIG. 9 is a flowchart diagram of a process for state delta computation and of the processing of corrective actions in accordance with the embodiment presented in FIG. 5. The manager software 200 can implement operations of the process to compute the difference or delta between the current local state and target local state. A state orchestrator provides one or more corrective actions to a sync module which computes a delta. The sync module provides the one or more corrective actions to the state orchestrator, which then submits the actions to the action engine. For each request, the action engine produces a JMS request for the application. For each response, if the request is not valid then the application returns a validation error and the action engine logs the error and updates monitoring metrics. If the request is valid then the application returns a success notification and the action engine updates the monitoring metrics.

The state update process can be triggered by different events or triggers. A first example update process trigger is periodically on a given frequency. A second example update process trigger is when the local state is updated. A third example update process trigger is when the target local state is updated. The three example triggers can all be used. For example, the trigger of periodically updating can allow the management software 200 to capture a scenario where all actions would be rejected, which would not be detected by the second example trigger (e.g. when the local state is updated).

To avoid flooding the systems with irrelevant requests, this process can be synchronized to not run multiple times concurrently. In addition the system prevent executing the synchronization process twice in less than a minimum configurable period (e.g. implement a cool-down timer following an instance of the synchronization process). Moreover, in some embodiments, to avoid over-flooding the requests with too many requests at once, the management software 200 can implement a request rate limiter to only allow a given number requests active at all time.

In some embodiments, the management software 200 can log the result of requests. In addition to ease monitoring, the management software 200 can generate metrics to count: the number of update processes executed; the number of successful requests; the number of failed requests related to a validation error; the number of failed requests related to a general error; and so on.

The management software 200 can also gather statistics on the number of iterations required by a request to be properly executed. The management software 200 can transmit the metrics or statistics to the remote computer 150.

Figure 10:
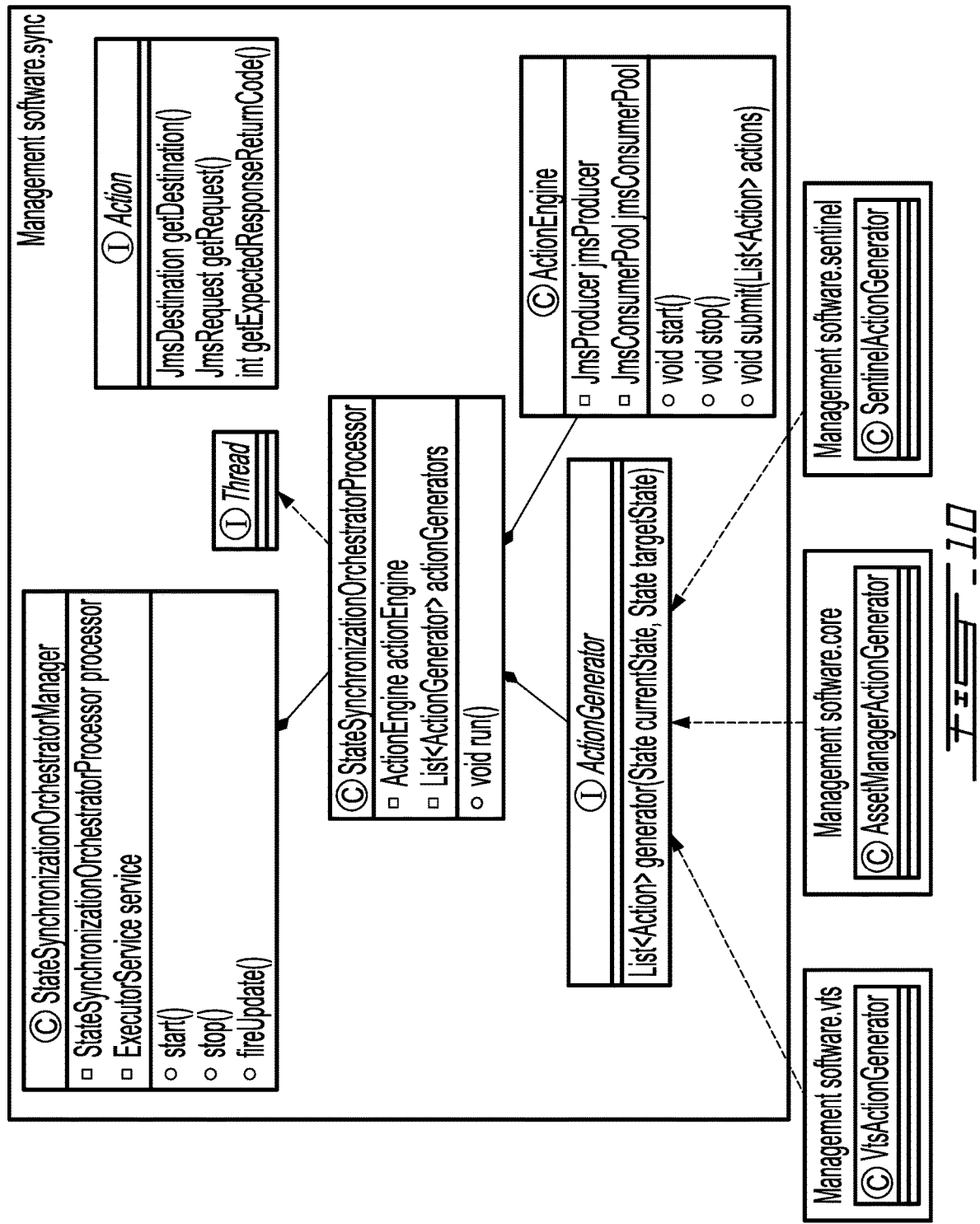
FIG. 10 is an example class diagram for the management software 200.

FIG. 10 is an example class diagram for the management software 200 of the local computer 100. The management software 200 can be defined by different classes. For example, a state synchronization orchestration manager can be defined by a state synchronization orchestration processor and a executor service. The state synchronization orchestration processor can be defined by an action engine and an action generator. The action engine can be defined by producer, and consumer pool. An action generator can be defined by generate current state and generate target local state. An action can be defined by a destination, request, and an expected response return code.

As can be understood, the examples described above and illustrated are intended to be exemplary only. For instance, although examples presented above present managed devices used in the monitoring of large electric machines, in an alternate embodiment, the managed devices can be used in relation with the monitoring of other systems, such as systems in the healthcare industry for instance. Various changes, substitutions and alterations can be made herein. The scope is indicated by the appended claims.

What is claimed is:

1. A local computer for managing managed devices, the managed devices and the local computer being local to a facility having at least one electric machine monitored by sensors, the electric machine having a peak power of at least 100 kW, the managed devices having at least one acquisition unit for the sensors, the managed devices configured to communicate over a local network, the local computer positioned at a boundary between the local network and a telecommunications network, the local computer configured to communicate i) with the managed devices via a local network and ii) with a remote computer via a telecommunications network, the local computer having:
    a hardware processor;
    non-transitory memory storing executable instructions which, when executed by the hardware processor, cause the local computer to:
        compute actions corresponding to the difference between a current local state of the managed devices and a target local state for the managed devices, said actions to be executed by the managed devices for bringing the current local state into compliance with the target local state, said actions including a first action and a second action, the first action dependent on the second action for execution;
        communicate the actions to the managed devices, via the local network, for execution;
        subsequently to said communicating the actions, monitor current states of the managed devices, including detecting a change in the current states of the managed devices, the change reflecting the execution of at least the second action at the managed devices, and update the current local state to reflect the change;
        compute updated actions corresponding to an updated difference between the current local state and the target local state, following said updating, said second action being absent from the updated actions, said first action being present in the updated actions;
        communicate the updated actions, including the first action, to the managed devices, via the local network.

2. The local computer of claim 1 wherein the local network is based on an Industrial Internet of Things (IIOT) protocol.

3. The local computer of claim 1 wherein the telecommunications network is the Internet.

4. The local computer of claim 1 wherein said communicating the actions to the managed devices includes communicating the actions without specifying an order in which multiple actions are to be executed on a given managed device.

5. The local computer of claim 1 wherein said compute actions and said compute updated actions includes computing a difference between the target local state and the current local state.

6. The local computer of claim 1 further comprising repeating the steps of detecting a change, updating the current local state, computing updated actions and communicating the updated actions until either all actions are determined to have been executed.

7. The local computer of claim 1 wherein the presence of the first action in the updated actions is indicative of the first action not having been executed following said communication of said actions; further comprising repeating the steps of detecting a change, updating the current local state, computing updated actions and communicating the updated actions until a predetermined condition has been met, wherein the predetermined condition is one of an amount of iterations and an amount of time elapsed.

8. The local computer of claim 7 further comprising the local computer communicating to the remote computer a message indicative of actions which have not been completed when the predetermined condition is met.

9. The local computer of claim 1 wherein the instructions comprise an appliance state reader for computing the current local state, and storing the current local state in the memory, wherein the appliance state reader acquires and builds the current local state using one or more integrated drivers adapted to different types of devices.

10. The local computer of claim 1 wherein the change includes a change of a parameters of a managed device.

11. The local computer of claim 1 wherein the managed devices include a local alarm engine, wherein the actions include at least one of changing alarm rules of the local alarm engine, or changing alarm actions triggered by corresponding alarm rules.

12. The local computer of claim 1 wherein the managed devices includes a module of the local computer.

13. A method of managing managed devices with a local computer, the managed devices and the local computer being local to a facility having at least one electric machine monitored by sensors, the electric machine having a peak power of at least 100 kW, the managed devices having at least one acquisition unit for the sensors; the method comprising:
    computing actions corresponding to the difference between a current local state of the managed devices and a target local state for the managed devices, said actions to be executed by the managed devices for bringing the current local state into compliance with the target local state, said actions including a first action and a second action, the first action dependent on the second action for execution;
    communicating the actions to the managed devices, via the local network, for execution;
    subsequently to said communicating the actions, monitoring current states of the managed devices, including detecting a change in the current states of the managed devices, the change reflecting the execution of at least the second action at the managed devices, and updating the current local state to reflect the change;
    computing updated actions corresponding to an updated difference between the current local state and the target local state, following said updating, second action being absent from the updated actions, said first action being present in the updated actions;
communicate the updated actions, including the first action, to the managed devices, via the local network.

14. The local computer system of claim 1 further comprising determining that the change in the state was not initiated by the local computer.

15. The local computer of claim 1 further comprising communicating an indication of the change to the remote computer, via the telecommunications network, when the change is determined to have not been initiated by the local computer.

16. The local computer of claim 1 further comprising communicating to the managed devices, via the local network, actions to be executed by the managed devices for reversing the change when the change is determined to have not been initiated by the local computer.

17. The local computer of claim 1 wherein the change further reflect the execution of the second action at one of the managed devices, and the instructions, when executed by the hardware processor, further cause the local computer to:

subsequently to said communicating the updated instructions, monitor current states of the managed devices, including detect a change in the current states of the managed devices, the change reflecting the execution of the first action at the one of the managed devices, and update the current local state to reflect the change.

18. The local computer of claim 1, wherein the actions include at least one of changing a sampling frequency of one or more of the sensors.

19. The local computer of claim 1 wherein at least one of the actions involves changing a parameter of one or more of the managed devices, the parameter dictating or representing an operational behavior of the one or more managed devices or of an other device associated to the one or more managed devices.

* * * * *